United States Patent [19]
Smith et al.

[11] Patent Number: 5,955,928
[45] Date of Patent: *Sep. 21, 1999

[54] AUTOMATICALLY ADJUSTING THE DYNAMIC RANGE OF THE VCO IN A PLL AT START-UP FOR OPTIMAL OPERATING POINT

[75] Inventors: Randon Wayne Smith; Lee Stuart Tavrow; Mark Ronald Santoro, all of Sunnyvale, Calif.

[73] Assignee: Micro Magic, Inc., Sunnyvale, Calif.

[*] Notice: This patent issued on a continued prosecution application filed under 37 CFR 1.53(d), and is subject to the twenty year patent term provisions of 35 U.S.C. 154(a)(2).

[21] Appl. No.: 08/773,394

[22] Filed: Dec. 26, 1996

[51] Int. Cl.⁶ .............................. H03L 7/07; H03L 7/087; H03L 7/10
[52] U.S. Cl. .................................. 331/2; 331/11; 331/14; 331/16; 331/17; 331/25; 331/57
[58] Field of Search .................................. 331/2, 10, 11, 331/14, 16, 17, 25, 57

[56] References Cited

U.S. PATENT DOCUMENTS

| | | |
|---|---|---|
| 4,511,858 | 4/1985 | Charavit et al. ............................ 331/17 |
| 4,562,410 | 12/1985 | O'Rourke ................................... 331/25 |
| 5,142,249 | 8/1992 | Hirotomi ..................................... 331/57 |
| 5,382,922 | 1/1995 | Gersbach et al. ......................... 331/1 A |
| 5,477,194 | 12/1995 | Nagakura ................................... 331/10 |

*Primary Examiner*—Siegfried H. Grimm
*Attorney, Agent, or Firm*—Limbach & Limbach LLP

[57] ABSTRACT

A phase locked loop (PLL) circuit includes a phase comparator that compares the phases of an input signal and a feedback signal and generates UP and DOWN pulses that are related to the phase difference. A charge pump receives the UP and DOWN pulses from the phase comparator and either charges or discharges the tuning voltage of a loop filter. The voltage controlled oscillator (VCO) provides an output signal that has a frequency that is related to the tuning voltage. A frequency divider then divides the frequency of the VCO output by a factor of N and provides the output as the feedback signal to the phase comparator. The PLL includes pre-lock circuitry that responds to an active state of a pre-lock input signal by narrowing the dynamic range of the VCO to a pre-lock range that is centered around a predetermined final frequency and that deactivates upon achieving the pre-lock range.

8 Claims, 6 Drawing Sheets

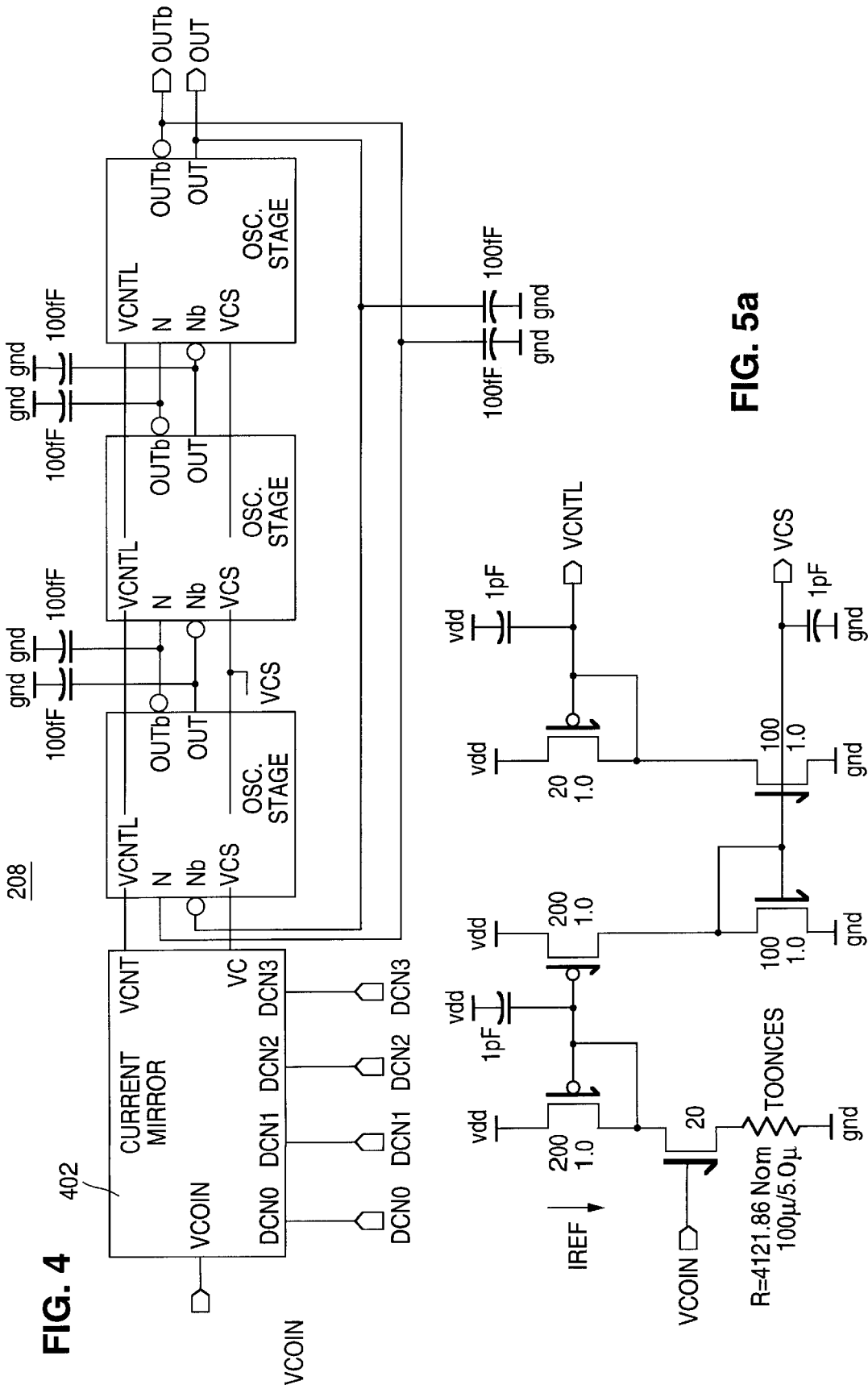

AUTOMATICALLY ADJUSTING THE DYNAMIC RANGE OF THE VCO IN A PLL AT START-UP FOR OPTIMAL OPERATING POINT

BACKGROUND OF THE INVENTION

1. Field of Invention

The present invention relates to voltage controlled oscillators (VCO) used in phase locked loop (PLL) circuits and, in particular, to methods and circuitry for reducing the required gain in the VCO to make the loop more stable and less susceptible to noise.

2. Discussion of the Related Art

PLL's have found many applications in the electronics industry. Among their uses are frequency modulated (FM) signal generation and decoding, clock recovery in digital communications, and clock multiplication in digital circuits. It is the latter of these three applications to which the present invention is directed.

FIG. 1 shows a block diagram of a typical PLL 100. The PLL is a feedback control system where the phase and frequency of an incoming signal (clk) is compared to a generated feedback signal (ffb). In the clock multiplication application, the phase comparator (PFD) 102 will generate pulses that tell the charge pump 104 whether the input signal (clk) is faster or slower than the feedback signal (ffb). If the input signal is faster, then the phase comparator 102 will generate an "UP" pulse that is proportional in width to the difference in phase between the signals. Likewise, if the input signal is slower, then the phase comparator 102 will generate a "DOWN" pulse that is proportional in width to the phase difference. These pulses are fed to the charge pump 104, which either charges or discharges the loop filter 106. The amount of charge or discharge is proportional to the phase difference since it is controlled by the pulse width of the UP or DOWN signal received by the charge pump 104. The voltage on the loop filter 106 controls the VCO 108. The VCO 108 produces a frequency that is proportional to the voltage at it's input. That frequency (fvco) is then fed back through a divider 110 to the phase comparator 102 as the generated feedback signal (ffb).

The purpose of the divider 110 in the feedback path is to multiply the clock up. This is by virtue of the fact that the phase comparator 102 will attempt to match the frequencies of the signals at it's inputs. For this to happen, the VCO 108 must be running N times faster than the incoming signal, since the VCO output gets divided by N before it gets compared to the incoming signal. The result is that the output of VCO 108 is equal to N times the input frequency and, hence, provides a clock multiplier.

A common problem in PLL's used for clock multiplication is that the gain in the VCO is extremely high. As stated earlier, the VCO is a circuit that will generate a frequency that is proportional to the voltage at it's input. The gain of the VCO is a measure of the change in the output frequency for a given change in the input voltage, and is given in Hz per Volt. It is desired to keep this gain term as low as possible to reduce the sensitivity of the VCO to noise on the tune node, and to keep the loop gain down. If there is too much gain in the loop, then it is difficult to attenuate the gain and achieve reasonable phase margin at the gain crossover point without using very large components in the filter. Three major sources of this high gain are lower power supplies, higher frequencies, and wide environmental variations.

A common goal in digital circuits is to reduce power consumption by lowering the supply voltage. By doing so, the gain goes up due to the reduced compliance range on the input of the VCO. As an example, assume a VCO must cover a 200 MHz range and the input to the VCO has a range from 0.5V above ground to 0.5V below the power supply. In a 5 volt system, the gain of the VCO would be 50 MHz/V (i.e. 200 MHz/(5−0.5)-(0+0.5)). However, if the power supply is lowered to 3.3 volts, the gain goes up to 87 MHz/V (i.e. 200 MHz/(3.3−0.5)-(0+0.5)). Higher frequencies also play a role in this. If a VCO must cover a 2× range of frequencies, the gain is doubled if that range is from 200 MHz to 400 MHz (i.e. 200 MHz range) rather than from 100 MHz to 200 MHz (i.e. 100 MHz range). Environmental variations are always present in integrated circuits and must be compensated for in the VCO. Even if the only frequency of interest is 100 MHz, the final VCO will likely need to cover a wide range of frequencies at typical conditions in order to cover variations in temperature, voltage and process. For instance, it may be that the VCO will need to cover a range of 50 MHz to 200 MHz at typical conditions so that, whether the circuit is running at hot or cold temperature, high or low voltage, or at the fast or slow process corner, the VCO will still have the 100 MHz desired frequency in it's operating range.

The problem with the implementation in FIG. 1 is that it makes no attempt to reduce the gain of the VCO 108. Although the loop will function (if designed correctly), it will be more susceptible to noise on the tune node, and will require larger components in the loop filter in order to attenuate the loop gain.

SUMMARY OF THE INVENTION

The preferred embodiment of the present invention provides a phase locked loop (PLL) circuit that includes preconditioning of the voltage controlled oscillator (VCO) to reduce the frequency range and the gain of the VCO. The PLL includes a phase comparator that compares the phases of an input signal and a feedback signal and, if the input signal is faster than the feedback signal, generates an UP pulse that is related to the phase difference and, if the input signal is slower than the feedback signal, generates a DOWN pulse that is related to the phase difference. A charge pump receives the UP and DOWN pulses from the phase comparator and either charges or discharges the tuning voltage output of the loop filter. The amount of tuning charge or discharge is related to the UP and DOWN pulses, respectively. The loop's voltage controlled oscillator (VCO) responds to the tuning voltage by providing an output signal that has a frequency that is related to the tuning voltage. The frequency divider then decreases the frequency of the VCO output by a factor of N and provides the output as the feedback signal to the phase comparator. In accordance with the invention, the PLL includes pre-lock circuitry that asserts a pre-lock signal upon startup of the device. The asserted pre-lock signal causes pre-lock circuitry to adjust the voltage controlled oscillator such that the center frequency of the VCO matches the frequency of the input signal multiplied by N. Since this action is done at startup of the device, it is possible to shrink the range over which the VCO must operate to cover variations in temperature and voltage. Variations in process are compensated for by centering the range around the frequency of interest (i.e. the pre-lock). This is where the reduction in gain in the VCO is realized. Since process variations are already compensated for by the pre-lock, the operating range of the VCO does not need to compensate for process variations. Hence, the range of the VCO can be smaller and the gain can be lower. Once the pre-lock condition is achieved, the pre-lock circuitry deasserts the pre-lock signal, which allows the tuning voltage of the loop filter to be controlled by the charge pump.

In the preferred embodiment, the pre-lock circuitry includes pre-lock control logic that controls the pre-lock signal by asserting it when the device starts up, and deasserting it once pre-lock is achieved. A digital phase detector responds to the active state of the pre-lock signal by providing an UP output signal if the input signal is faster than the feedback signal and a DOWN output signal if the input signal is slower than the feedback signal. A digital control element responds to the UP and DOWN output signals provided by the digital phase detector by providing a digital control signal to the VCO that corresponds to the cumulative total of the UP and DOWN pulses received by the control element. The value of the digital control signal controls the amount of static current in the reference current generator of the VCO. While the pre-lock signal is asserted, the charge pump responds by forcing the tuning voltage to mid-rail. While the pre-lock signal is deasserted, the charge pump forces the tuning voltage to a value according to the UP and DOWN pulses received from the phase detector and the state of the digital control signal to the VCO is locked in and does not change.

In a typical application, the pre-lock will only occur once when the device is started up. If it is desired to pre-lock the PLL a second time without halting the operation of the device, this can be done by running two PLL's, each with pre-lock capabilities, on the device. At all times, one of the PLL's will be supplying the desired output frequency while the other attains the next pre-lock state. If the environment that the device is operating in drifted enough to warrant switching to the other PLL, this can be done seamlessly. Once the switch is made and the new PLL is supplying the desired output frequency, then the PLL that was originally supplying the desired output frequency can be pre-locked again to attain the next pre-lock state. This allows an even smaller frequency range over which the VCO must operate since variations in temperature and voltage can be compensated for on the fly by switching between the two PLL's. Since the range of the VCO is lower, the gain will also be lower resulting in even better loop stability and immunity to noise on the tune node.

A better understanding of the features and advantages of the present invention will be obtained by reference to the following detailed description and accompanying drawings which set forth an illustrative embodiment in which the principles of the invention are utilized.

BRIEF DESCRIPTION OF THE DRAWINGS

FIG. 4 is a block diagram illustrating an embodiment of a voltage controlled oscillator utilizable in the FIG. 2 phase locked loop circuit.

FIG. 5a is a schematic diagram illustrating a current mirror utilizable in a conventional PLL.

DETAILED DESCRIPTION OF THE INVENTION

When a PLL is used in digital circuits to multiply the incoming clock frequency up, the frequency at which the VCO is oscillating and the frequency at which the incoming signal is oscillating will typically not change while the circuit is active. In this application, it might be said that the VCO needs to maintain a particular frequency over variations in process, temperature and voltage. Since both frequencies are known, and they will not change, it would be nice to center the VCO operating range around this point. Doing so minimizes the range over which the VCO needs to operate by reducing the effect of process variations. This can be accomplished by breaking the locking process into two steps. The first step is to adjust the VCO so that it's center frequency matches the incoming frequency multiplied by N. This compensates for variations in process. This step in the locking process will be termed the "pre-lock." The second step is to close the loop and allow the input to the VCO to be controlled by the phase detector and charge pump. Note that after performing the pre-lock, the only variables left in the loop that can change are temperature and voltage. This will drastically reduce the range over which the VCO will need to operate.

Note that the pre-lock needn't be exact. This step is only a rough tuning of the VCO. If the center of the operating range is not exactly obtained, it will not necessarily ruin the operation of the loop. It does mean that the VCO will have to cover a wider range of frequencies, resulting in a higher gain VCO. Therefore, the closer one can get to the center frequency, the narrower one can make the frequency range of the VCO, and the resulting gain of the VCO will be lower. Error in the center frequency means only that the gain cannot be gotten optimally low.

One drawback of this approach is that once the system has switched from pre-lock mode to normal operation, it cannot go back without halting the operation of the chip. If temperature and voltage variations cause the PLL to reach the compliance limit on the input of the VCO and the system wanted to go back and pre-lock the loop again, the loop would have to be opened and would become unlocked. All timing relationships between the reference frequency and the VCO output would be lost until the loop was able to re-lock.

Figure 6:
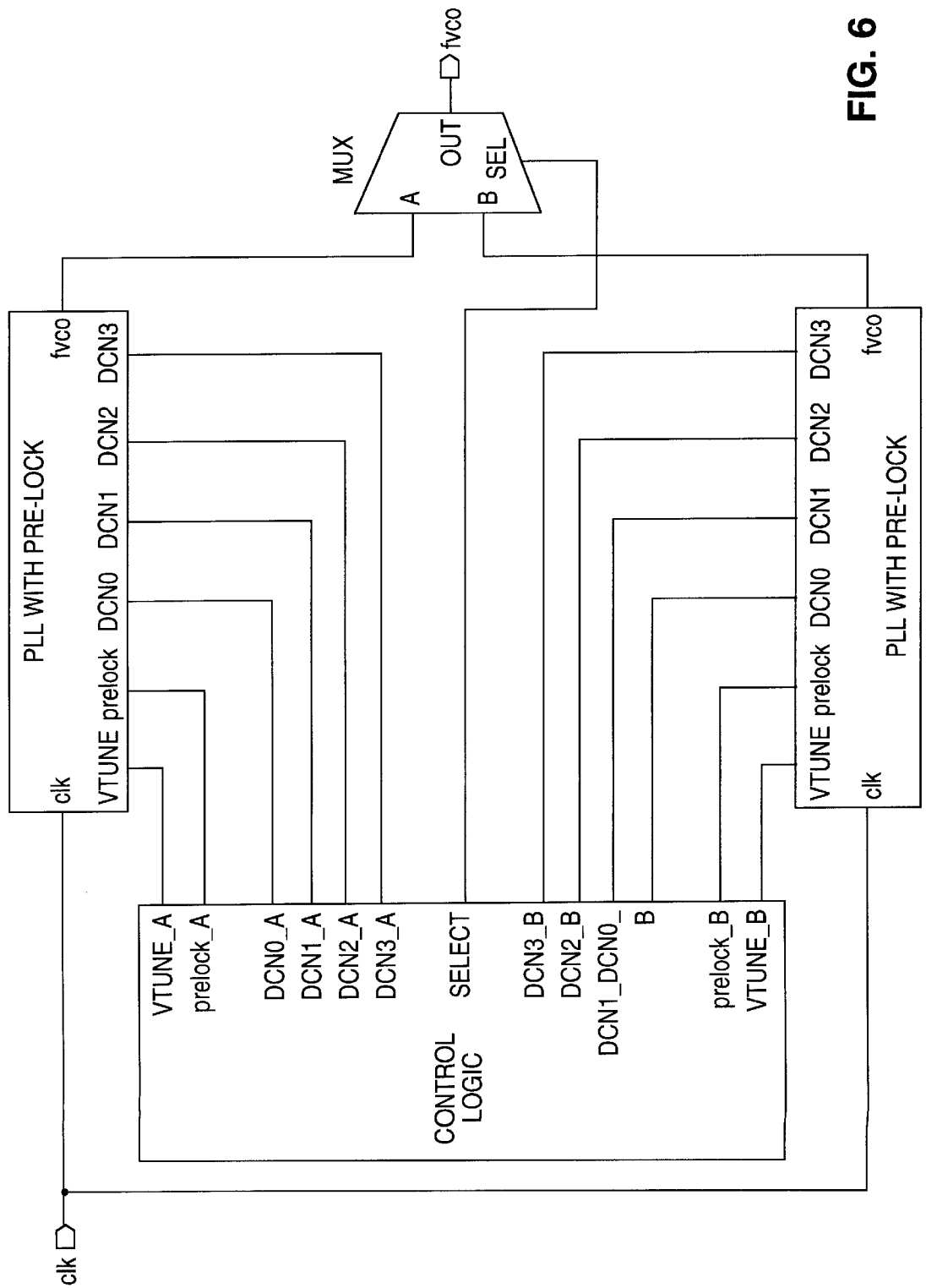
FIG. 6 is a schematic diagram illustrating a configuration where two PLL's are used to allow switching from one pre-lock condition to the next.

One way around this problem is to have two PLL's running simultaneously. Both would be locked onto the reference frequency, but they would be pre-locked to different center frequencies. That way, when the compliance limit of one PLL is reached, one could seamlessly switch to the other PLL since they are both locked. FIG. 6 shows this implementation. Note that there are many ways to implement this. For example, one could have the second PLL continuously in pre-lock while the first is supplying the desired output frequency. In this embodiment, the tune node voltage of the first PLL is monitored. If the tune node is approaching a compliance limit on the input of the VCO, the pre-lock inputs to the VCO of the second PLL are adjusted to take the next pre-lock state that would move the tune node voltage more towards the center of the compliance range. Once the second PLL has made that change and achieved analog lock, the mux at the outputs of the PLL's can be switched so that the output of the second PLL is used. Note that when the switch is made, both PLL's are in analog lock with the input frequency. Since they are both in analog lock, both of their outputs must meet jitter and phase noise specs, and this is why switching between the two can be seamless without violating jitter and phase noise specs. At this point, the first PLL can be adjusted to occupy the next pre-lock state so that if the tune node of the second PLL begins to approach a compliance limit on the input of the VCO, the mux can be switched back to the first PLL to keep the tune node in the compliance range.

The "pre-lock" can be accomplished in a variety of ways. One way is to simply vary the number of stages in the VCO by muxing. Another way is to change the device sizes or the loads of each stage in the oscillator. It is intended that the concept of the present invention cover all implementations of a pre-lock PLL.

In the preferred embodiment of the invention, a VCO is used wherein the pre-lock is performed by digitally programming a static current in the reference current generator of the VCO. This static current is an offset that will set the center frequency of the VCO. In the locked state, this current will be constant and will always be flowing.

Figure 1:
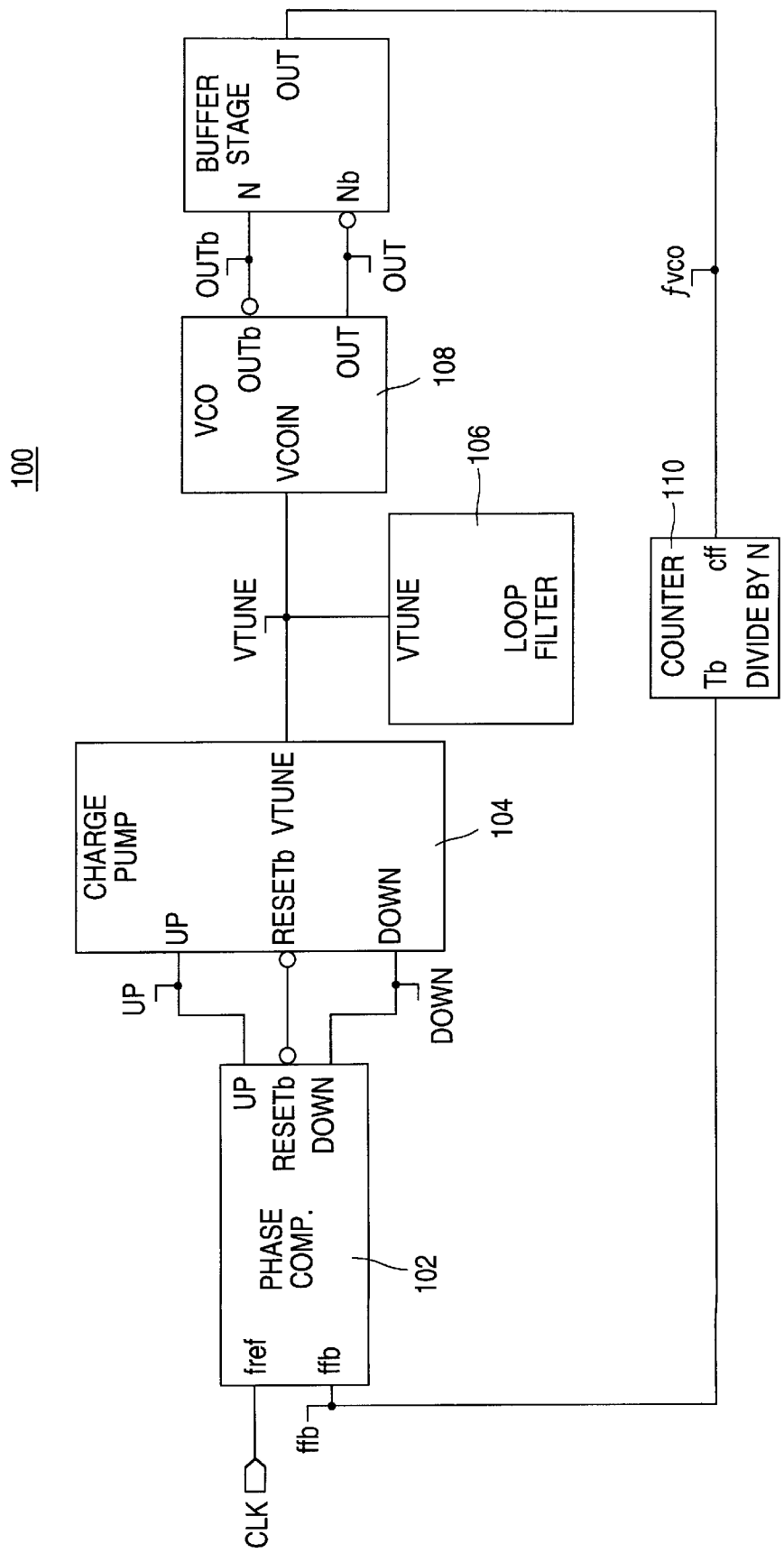
FIG. 1 is a block diagram illustrating a conventional phase locked loops circuit.
Figure 2:
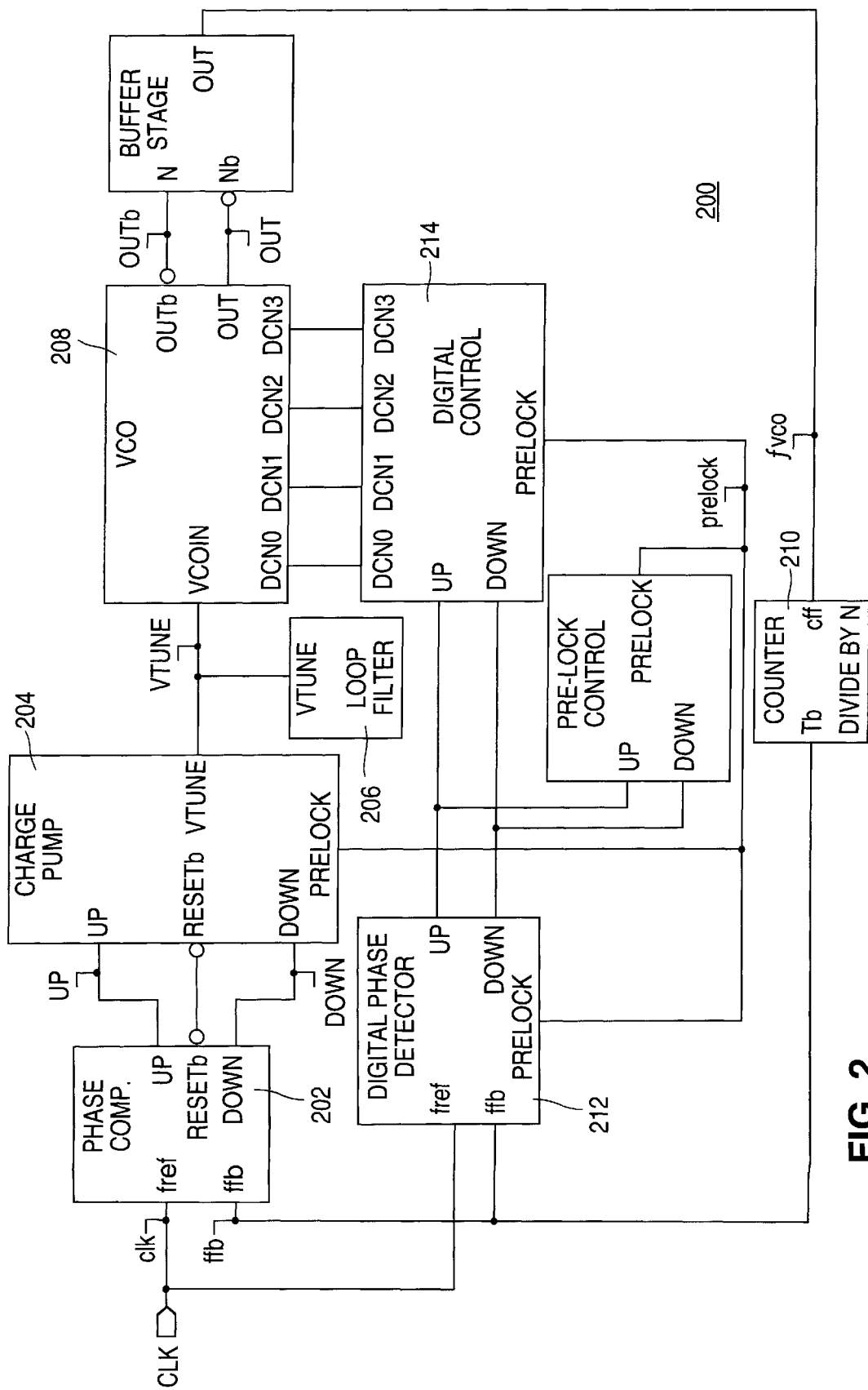
FIG. 2 is a block diagram illustrating an embodiment of a phase locked loop circuit in accordance with the present invention.

FIG. 2 shows this PLL implementation 200. It is similar to the implementation shown in FIG. 1, but has three extra blocks and extra signals running to the charge pump 204 and the VCO 208. The first new feature to be discussed is the pre-lock signal. This signal controls whether the loop is in pre-lock mode, or in analog lock mode. When the signal is high, the loop is in pre-lock; low means analog lock. The logic controlling this signal is contained in the pre-lock control block (PLCNTL) of FIG. 2. Once again there are many ways to implement this block of logic. The simplest way would be to use a counter that would be programmed to assert the pre-lock signal on startup and count a predetermined number of clock cycles before deasserting the pre-lock signal. Note that the number of clock cycles counted would need to be enough to guarantee that pre-lock will be achieved under all process, temperature and voltage variations. In this embodiment, the pre-lock control block will start by forcing the pre-lock output high when the chip is started up. After that, it will monitor the UP and DOWN pulses being emitted by the DPFD. Once the pattern of one UP pulse, followed by one DOWN pulse, followed by one UP pulse, and finally followed by a DOWN pulse is detected, the pre-lock control block will force the prelock output low. This pattern of UP-DOWN-UP-DOWN indicates that the pre-lock circuitry has centered the VCO as close as possible to the input frequency. This block provides the automatic control of the pre-lock circuitry.

Figure 3:
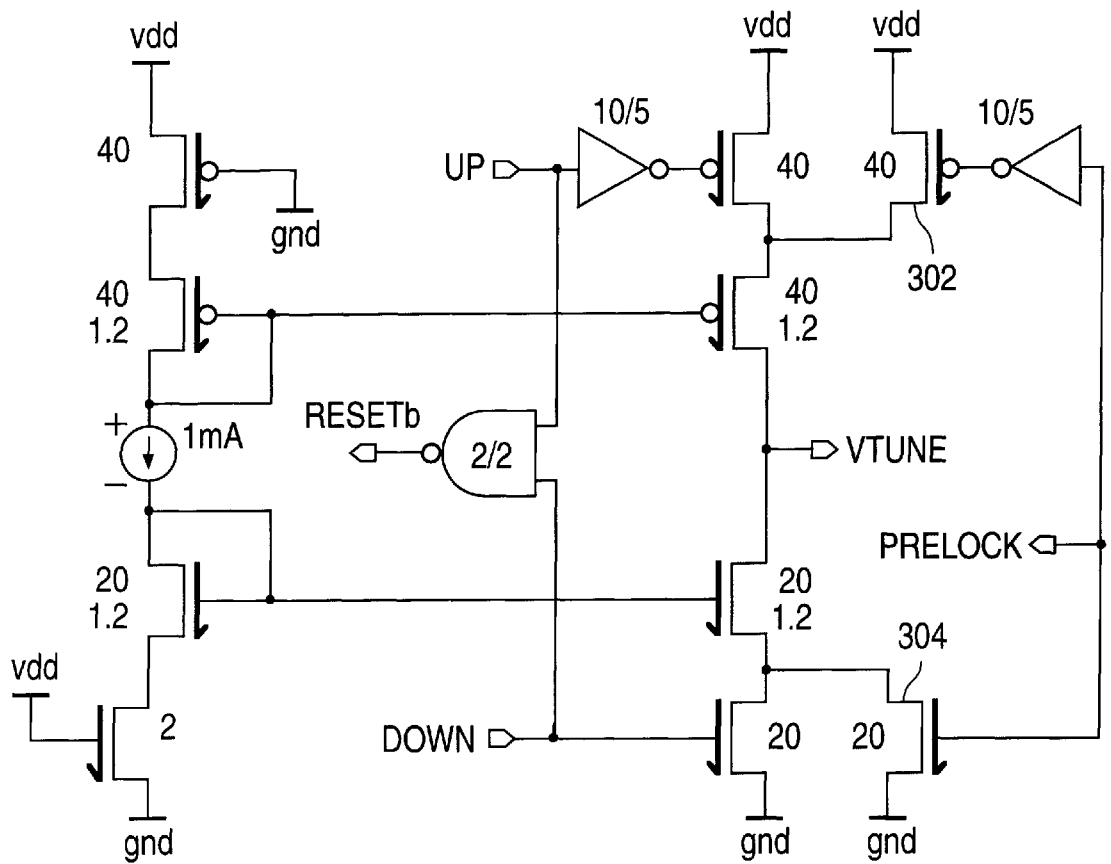
FIG. 3 is a schematic diagram illustrating an embodiment of a charge pump circuit utilizable in the FIG. 2 phase locked loop circuit.

An embodiment of the charge pump circuit 204 is shown in detail in FIG. 3. It is configured such that when the prelock signal is high, it forces the tune node (VTUNE) to approximately mid-rail. This is done by turning on both the pull-up device 302 and the pull-down device 304 in the charge pump. In the standard PLL charge pump, the prelock signal does not exist and the pull-up and pull-down devices (302, 304) being driven by the prelock signal are not present. Forcing the tune node to mid-rail dictates that the center frequency of the VCO 208 will appear at the output. With the tune node in this state, the VCO 208 can now be adjusted to obtain the desired center frequency.

Referring back to FIG. 2, one of the added blocks is the digital phase detector (DPFD) 212. When the PLL 200 is in pre-lock, this phase detector 212 is active and samples the input frequency and the feedback frequency (ffb) much the same as the PFD 202. However, in this case, it is not important for the UP and DOWN pulses to be proportional to the phase difference, and the DPFD will sample 10 cycles at its fref or ffb inputs in order to determine whether to emit an UP or a DOWN pulse.

The reason that the pulses need not be proportional to the phase difference is that they are only going to be used to control an UP/DOWN counter in the digital control block 214, which is described in greater detail below. An UP pulse will only cause the counter to count up 1, and a DOWN pulse will only cause the counter to count down 1.

The reason for sampling more than one cycle at the inputs of the DPFD 212 is to eliminate the chance that the loop will oscillate in the pre-lock mode. By implementing the pre-lock, a whole new feedback control system has been created, with it's own loop equation and gain terms. This new system must be characterized just like the loop in the analog state. By sampling 10 cycles, the DPFD allows the VCO to settle to it's new state before making a decision on whether to emit an UP or DOWN pulse.

As stated above, the digital control block 214 is simply an UP/DOWN counter. It is enabled by the prelock input. When prelock is high, a pulse at the UP input causes the counter to increment by 1; and a pulse on the DOWN input causes the counter to decrement by 1. When the prelock input is low, the counter will hold it's present state and ignore any pulses at the UP and DOWN inputs. What this does is set the state of the DCN0–DCN3 inputs to the VCO 208. The state of these nodes controls the amount of static current.

Figure 5B:
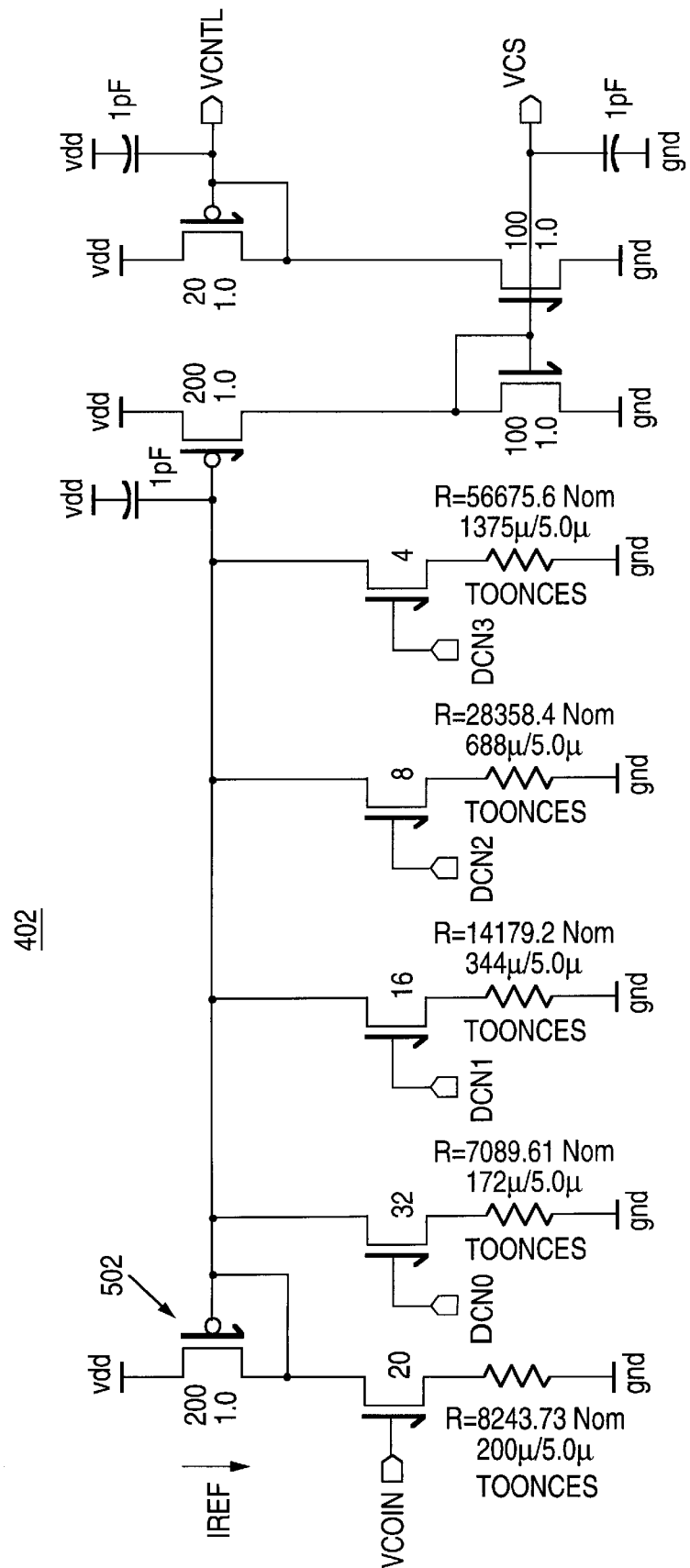
FIG. 5b is a schematic diagram illustrating an embodiment of a current mirror utilizable in the FIG. 4 VCO.

FIG. 4 shows the VCO 208. This is virtually the same VCO that is used in the PLL 100 of FIG. 1 except that the current mirror (CURMIR) block 402 receives the four digital inputs DCN0–DCN3. The current mirror used in the standard PLL 100 of FIG. 1 is shown in FIG. 5a; the current mirror 402 used in the pre-lock PLL 200 of FIG. 2 is shown in FIG. 5b. The way the FIG. 5b circuit 402 operates is that the current flowing through the PMOS device 502 in the upper left of the schematic (designated "IREF") is the reference current. The current flowing through each stage of the oscillator will match that reference current. More current implies that each stage of the oscillator will switch faster and the frequency of the oscillation will be faster; less current implies slower switching and a slower oscillation. Hence, controlling the current through that PMOS device 502 will control the speed at which the oscillator is oscillating.

In the standard current mirror (FIG. 5a), all of the current through the PMOS device 502 is controlled by the analog input (VCOIN). The range of that current must be sufficient to allow the oscillator to cover the range of frequencies needed. This includes compensating for variations in process, temperature and voltage.

In the digitally programmable current mirror 402 shown in FIG. 5b, the current through the PMOS device 502 is controlled by both the digital inputs (DCN0–DCN3) received from the digital control logic 214, and by the analog input (VCOIN). This is where the digital programming comes in to set the static current. In the pre-lock state, the DCN0–DCN3 inputs are programmed to set up a static current through the PMOS device 502 and, once out of pre-lock, those inputs will not change. That leaves the VCOIN input to control the current through the PMOS device 502. In this case, the range of current that must be forced through the PMOS device 502 is smaller because the digital inputs have been used to program the static current to compensate for variations in process and the analog input need only cover a range to compensate for temperature and voltage variations.

It should be understood that various alternatives to the embodiment of the invention described herein may be employed in practicing the invention. Thus, it is intended that the following claims define the scope of the invention and that methods and structures within the scope of these claims and their equivalents be covered thereby.

What is claimed is:

1. Phase lock loop circuitry that includes automatic pre-conditioning of a VCO, the phase lock loop circuitry comprising:
   a phase comparator that compares the phase of an input signal and the phase of a feedback signal and, if the input signal is faster than the feedback signal, generates an UP pulse, and, if the input signal is slower than the feedback signal, generates a DOWN pulse;
   a loop filter that provides a tuning voltage output signal;
   a charge pump that receives UP pulses and DOWN pulses from the phase comparator and respectively charges or discharges the tuning voltage output signal provided by the loop filter;
   a voltage controlled oscillator (VCO) that is connected to receive the tuning voltage output signal at a first VCO input node and that responds to the tuning voltage output signal by providing a VCO output signal frequency, the VCO having a second input node different from the first input node;
   a frequency divider that divides the frequency output of the VCO by a factor N, where N is an integer greater than or equal to one, to provide the feedback signal to the phase comparator; and
   pre-lock circuitry connected to provide a pre-lock control signal to the second input node of the VCO such that the pre-lock control signal automatically adjusts the frequency range of the VCO upon start-up of the phase lock loop circuitry.

2. Phase lock loop circuitry as in claim 1, and wherein the pre-lock circuitry responds to an active state of a pre-lock input signal by narrowing the frequency range of the VCO to a pre-lock frequency range such that a center frequency of the VCO matches the frequency of the input signal multiplied by N, and wherein, upon the VCO achieving the pre-lock frequency range, the pre-lock circuitry deactivates such that the tuning voltage output signal is controlled by the phase comparator and the charge pump.

3. Phase lock loop circuitry that includes automatic pre-conditioning of a VCO, the phase lock loop circuitry comprising:
   a phase comparator that compares the phase of an input signal and the phase of a feedback signal and, if the input signal is faster than the feedback signal, generates an UP pulse, and, if the input signal is slower than the feedback signal, generates a DOWN pulse;
   a loop filter;
   a charge pump that receives UP pulses and DOWN pulses from the phase comparator and respectively charges or discharges the tuning voltage output signal of the loop filter;
   a voltage controlled oscillator (VCO) that responds to the tuning voltage output signal of the loop filter by providing a VCO output signal frequency;
   a frequency divider that divides the frequency output of the VCO by a factor N, where N is an integer greater than or equal to one, to provide the feedback signal to the phase comparator;
   pre-lock circuitry that responds to an active state of a pre-lock input signal by narrowing the dynamic range of the VCO to a pre-lock range and that deactivates upon the VCO achieving the pre-lock range, the pre-lock circuitry including:

(i) pre-lock control circuitry that automatically generates the pre-lock input signal, the pre-lock input signal identifying whether the PLL is in a pre-lock mode or a normal operation mode, upon startup of the phase lock loop circuitry, the pre-lock input signal being asserted and remaining asserted until the pre-lock range is achieved by the VCO, and, upon the VCO achieving the pre-lock range, the pre-lock input signal being deasserted, thereby halting the pre-lock mode and initiating the normal operation mode, and remaining deasserted for the duration of the operation of the phase lock loop circuitry;
   (ii) a digital phase detector that responds to the active state of the pre-lock input signal by providing an UP output pulse if the input signal is faster than the feedback signal and a DOWN output pulse if the input signal is slower than the feedback signal; and
   (iii) a digital control element that responds to UP and DOWN output pulses provided by the digital phase detector by providing a digital control signal to the VCO that corresponds to the cumulative total of UP and DOWN output pulses received by the digital control element;
   wherein the digital phase detector and digital control element are used to set the dynamic range of the VCO to a minimum, such that the gain of the VCO will be a minimum and still allow operation of the phase lock loop circuitry over voltage and temperature changes.

4. Phase lock loop circuitry as in claim 3 and wherein the phase lock loop circuitry is connected between two voltages, and further wherein the charge pump responds to the active state of the pre-lock input signal by forcing the tuning voltage output signal of the loop filter to a level that is approximately mid-way between the two voltages, and, at the same time, the digital phase detector (DPFD) and digital control element are activated to set the state of the digital control signal applied to the VCO;
   wherein the value of the digital control signal controls the amount of static current in a reference current generator of the VCO.

5. Phase lock loop circuitry as in claim 4, and wherein, once the state of the digital control signal applied to the VCO is determined, the pre-lock input signal is deasserted, causing the digital phase detector to stop emitting UP or DOWN output pulses and causing the digital control element to lock in the state of the digital control signal applied to the VCO.

6. Phase lock loop circuitry as in claim 5, and wherein the charge pump responds to the deasserted state of the pre-lock input signal by forcing a voltage onto a tune node in response to the UP and DOWN pulses received from the phase comparator.

7. Phase lock loop circuitry as in claim 3, and wherein the charge pump is disabled during the pre-lock mode.

8. Phase lock loop (PLL) circuitry that dynamically conditions the voltage controlled oscillator (VCO) function of the PLL circuitry to reduce the frequency range and the gain of the VCO, the PLL circuitry comprising:
   (a) a first PLL that includes
   (i) a first phase comparator that compares the phase of an input signal and the phase of a first feedback signal and, if the input signal is faster than the first feedback signal, generates an UP pulse, and, if the input signal is slower than the first feedback signal, generates a DOWN pulse;
   (ii) a first loop filter;

(iii) a first charge pump that receives UP pulses and DOWN pulses from the first phase comparator and respectively charges or discharges the first tuning voltage output signal of the first loop filter;

(iv) a first voltage controlled oscillator (VCO) that responds to the first tuning voltage output signal of the first loop filter by providing a first VCO output signal frequency;

(v) a first frequency divider that divides the frequency output of the first VCO by a factor N, where N is an integer greater than or equal to one, to provide the first feedback signal to the first phase comparator; and (vi) first pre-lock circuitry connected to the first VCO for automatically adjusting the dynamic range of the first VCO, wherein the first pre-lock circuitry responds to an active state of a first pre-lock input signal by narrowing the dynamic range of the first VCO to a first pre-lock range such that a first center frequency of the first VCO matches the frequency of the input signal multiplied by N, and wherein, upon the first VCO achieving the first pre-lock range, the first pre-lock circuitry deactivates such that the first tuning voltage output signal is controlled by the first phase comparator and the first charge pump;

(b) a second PLL that includes (i) a second phase comparator that compares the phase of an input signal and the phase of a second feedback signal and, if the input signal is faster than the second feedback signal, generates an UP pulse, and, if the input signal is slower than the second feedback signal, generates a DOWN pulse;

(ii) a second loop filter;

(iii) a second charge pump that receives UP pulses and DOWN pulses from the second phase comparator and respectively charges or discharges the second tuning voltage output signal of the second loop filter;

(iv) a second voltage controlled oscillator (VCO) that responds to the second tuning voltage output signal of the second loop filter by providing a second VCO output signal frequency;

(v) a second frequency divider that divides the frequency output of the second VCO by the factor N, to provide the second feedback signal to the second phase comparator; and (vi) second pre-lock circuitry connected to the second VCO for automatically adjusting the dynamic range of the second VCO, wherein the second pre-lock circuitry responds to an active state of a second pre-lock input signal by narrowing the dynamic range of the second VCO to a second pre-lock range, different from the first pre-lock range, such that a second center frequency of the second VCO matches the frequency of the input signal multiplied by N, and wherein, upon the second VCO achieving the second pre-lock range, the second pre-lock circuitry deactivates such that the second tuning voltage output signal is controlled by the second phase comparator and the second charge pump;

(c) a multiplexer that receives the frequency output of the first VCO and the frequency output of the second VCO as mux input signals and provides either the frequency output of the first VCO or the frequency output of the second VCO as the frequency output of the phase lock loop circuitry based upon respective first and second logic states of a select input signal provided the multiplexer; and (d) control circuitry, connected to the first and second PLLs, that monitors the tuning voltage output signal of the VCO selected by the multiplexer and, in the event that the first tuning voltage output signal of the selected PLL is outside a predefined compliance range, adjusts the second prelock range of the second VCO to move the second tuning voltage output signal to the center of the compliance range and provides a select input signal having the second logic state to the multiplexer such that the multiplexer switches to provide the frequency output of the second VCO as the frequency output of the phase lock loop circuitry.

* * * * *